(12) United States Patent
Koide et al.

(10) Patent No.: US 11,191,161 B2
(45) Date of Patent: Nov. 30, 2021

(54) ELECTRONIC CIRCUIT

(71) Applicants: DENSO CORPORATION, Kariya (JP); TYCO ELECTRONICS JAPAN G.K., Kawasaki (JP)

(72) Inventors: Shiro Koide, Kariya (JP); Daisuke Dobashi, Tokyo (JP); Yohei Sakurai, Fujisawa (JP)

(73) Assignees: DENSO CORPORATION, Kariya (JP); TYCO ELECTRONICS JAPAN G.K., Kawasaki (JP)

( * ) Notice: Subject to any disclaimer, the term of this patent is extended or adjusted under 35 U.S.C. 154(b) by 0 days.

(21) Appl. No.: 16/941,362

(22) Filed: Jul. 28, 2020

(65) Prior Publication Data

US 2020/0359498 A1    Nov. 12, 2020

Related U.S. Application Data

(63) Continuation of application No. PCT/JP2019/003429, filed on Jan. 31, 2019.

(30) Foreign Application Priority Data

Jan. 31, 2018  (JP) .............................. JP2018-015601

(51) Int. Cl.
*H05K 1/11* (2006.01)
*H05K 1/14* (2006.01)
(Continued)

(52) U.S. Cl.
CPC ................ *H05K 1/14* (2013.01); *H01Q 1/12* (2013.01); *H01Q 1/36* (2013.01); *H05K 3/341* (2013.01); *H05K 3/36* (2013.01); *H05K 2201/10* (2013.01)

(58) Field of Classification Search
CPC ... H05K 1/11; H05K 1/14; H05K 1/16; H05K 1/117; H05K 1/165; H01R 12/51;
(Continued)

(56) References Cited

U.S. PATENT DOCUMENTS

| 5,291,368 A | * | 3/1994 | Conroy-Wass | ........ H05K 7/183 361/690 |
| 2004/0248432 A1 | * | 12/2004 | Barr | ...................... H01R 12/737 439/65 |

(Continued)

FOREIGN PATENT DOCUMENTS

WO    WO-2015158500 A1    10/2015

*Primary Examiner* — Xiaoliang Chen
(74) *Attorney, Agent, or Firm* — Harness, Dickey & Pierce, P.L.C.

(57) ABSTRACT

An electronic circuit includes a first printed wiring board, a second printed wiring board and a third printed wiring board. The second printed wiring board is mounted such that one edge of the second printed wiring board abuts on a part mounting surface of the first printed wiring board on which a part is mounted. The third printed wiring board is mounted such that one edge of the third printed wiring board abuts on the part mounting surface. The second and third printed wiring boards are connected to each other in a state where plate thickness directions thereof are oriented in different directions from each other about a normal line to the part mounting surface. Further, at least one of the second printed wiring board and the third printed wiring board is provided with an antenna pattern.

5 Claims, 12 Drawing Sheets

(51) Int. Cl.

| | |
|---|---|
| *H05K 1/16* | (2006.01) |
| *H01R 12/51* | (2011.01) |
| *H01R 12/52* | (2011.01) |
| *H01R 12/71* | (2011.01) |
| *H01R 12/72* | (2011.01) |
| *H01Q 1/22* | (2006.01) |
| *H01Q 1/38* | (2006.01) |
| *H01Q 1/50* | (2006.01) |
| *H01Q 9/40* | (2006.01) |
| *H01Q 9/42* | (2006.01) |
| *H01Q 1/12* | (2006.01) |
| *H01Q 1/36* | (2006.01) |
| *H05K 3/34* | (2006.01) |
| *H05K 3/36* | (2006.01) |

(58) Field of Classification Search
CPC ........ H01R 12/52; H01R 12/71; H01R 12/72; H01R 12/716; H01R 12/724; H01R 12/737; H01Q 1/22; H01Q 1/38; H01Q 1/50; H01Q 1/243; H01Q 9/40; H01Q 9/42; H01Q 9/0421
USPC ....... 361/760, 690, 719, 725, 730, 749, 753, 361/796; 439/61, 65, 74, 638, 906; 1/1
See application file for complete search history.

(56) References Cited

U.S. PATENT DOCUMENTS

| | | | |
|---|---|---|---|
| 2007/0178766 A1* | 8/2007 | Banerjee | H05K 1/025 439/638 |
| 2011/0122045 A1* | 5/2011 | Seo | H01Q 9/40 343/906 |
| 2016/0043484 A1* | 2/2016 | Brodsky | H01R 11/01 439/65 |
| 2021/0159623 A1* | 5/2021 | Sakurai | H05K 1/16 |

* cited by examiner

ELECTRONIC CIRCUIT

CROSS REFERENCE TO RELATED APPLICATIONS

The present application is a continuation application of International Patent Application No. PCT/JP2019/003429 filed on Jan. 31, 2019, which designated the U.S. and claims the benefit of priority from Japanese Patent Application No. 2018-015601 filed on Jan. 31, 2018. The entire disclosures of all of the above applications are incorporated herein by reference.

TECHNICAL FIELD

The present disclosure relates to an electronic circuit having an antenna pattern.

BACKGROUND

An electronic device, such as a telematics wireless device (hereinafter, TCU), may internally have an electronic circuit with an antenna. As structures of such an antenna, various structures have been proposed, in addition to the structure in which an antenna pattern is formed on a main board of an electronic circuit (for example, on a printed wiring board on which an IC chip and the like are mounted). Specifically, there have been proposed a structure in which an antenna pattern is formed on a rigid board, an antenna formed by processing a sheet metal, a flexible printed wiring board (hereinafter, FPC), or an antenna produced by a laser direct structuring (hereinafter, LDS). However, in various antennas other than the structure in which the antenna pattern is formed on the main board, the antenna is usually attached to the main board in a step different from a soldering step for a surface-mounting or the like, hence hampering the enhancement of productivity of the electronic circuit.

SUMMARY

The present disclosure describes an electronic circuit including a first printed wiring board, a second printed wiring board and a third printed wiring board. The first printed wiring board has a part mounting surface on which a part is mounted. The second printed wiring board is mounted such that one edge of the second printed wiring board abuts on the part mounting surface of the first printed wiring board. The third printed wiring board is mounted such that one edge of the third printed wiring board abuts on the part mounting surface of the first printed wiring board. The second printed wiring board and the third printed wiring board are connected to each other in a state in which a board thickness direction of the second printed wiring board and a board thickness direction of the third printed wiring board are oriented in different directions from each other, about a normal line normal to the part mounting surface. Further, at least one of the second printed wiring board and the third printed wiring board is provided with an antenna pattern.

DETAILED DESCRIPTION

Figure 1:
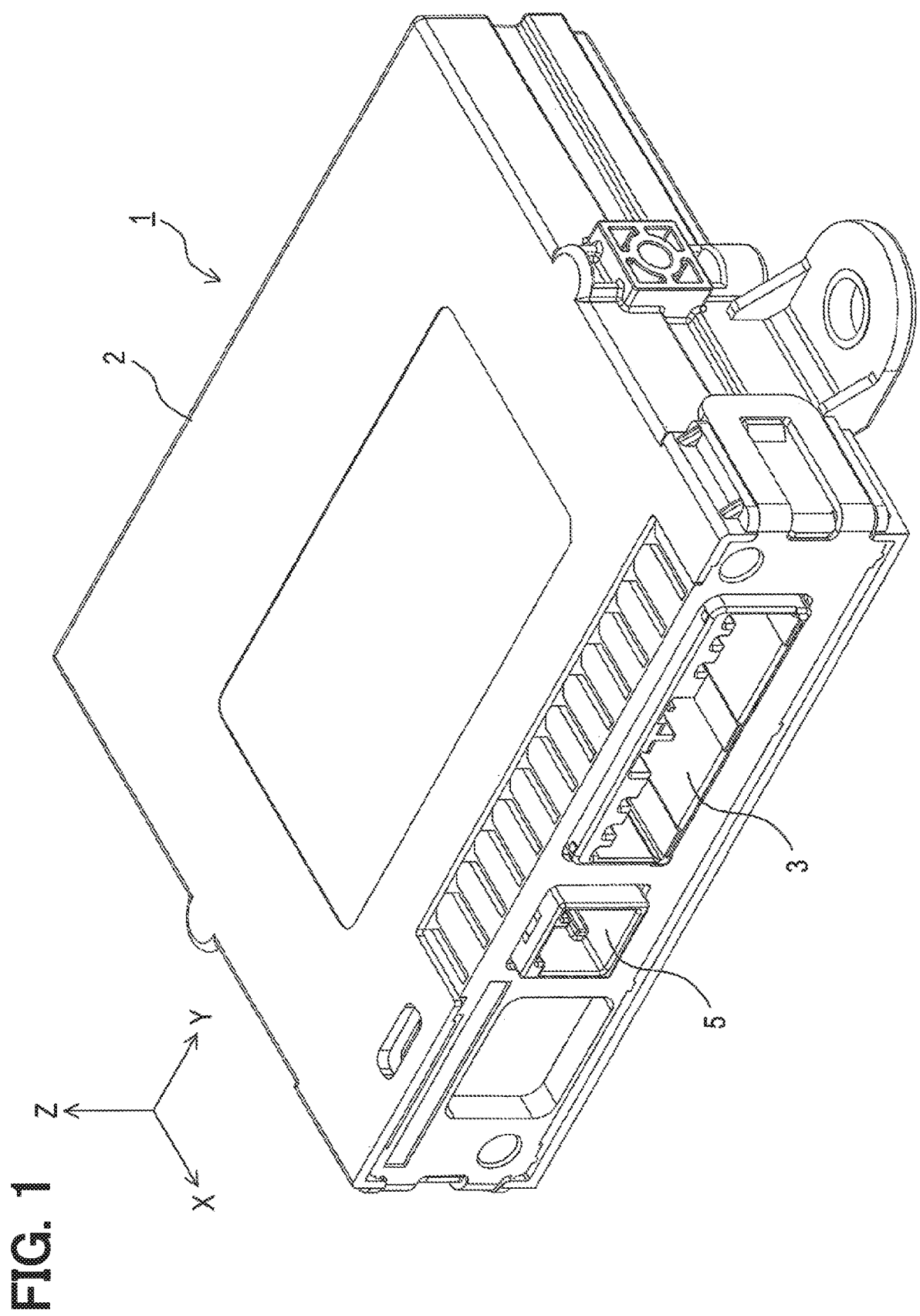
FIG. 1 is a perspective view of an antenna unit according to a first embodiment.

As an exemplary structure of the antenna, a printed wiring board (hereinafter referred to as the antenna board) formed with an antenna pattern may be surface-mounted on a main board by a reflow-soldering, in a state of being orthogonal to the main board. In such an exemplary structure, however, as a result of detailed investigation of the inventors, it was found that there is a possibility that an antenna board falls over during the reflow-soldering. For that reason, it is conceivable that, when the above exemplary structure is actually put into practice, a step of attaching a special structure part to the antenna board or the main board is needed. In such a case, production costs for the electronic circuit will increase and the size of the electronic circuit will increase.

An aspect of the present disclosure is to provide an electronic circuit in which an antenna pattern can be surface-mounted on a predetermined printed wiring board in a standing position relative to the printed wiring board, while suppressing use of a special structure part.

An electronic circuit according to an aspect of the present disclosure includes a first printed wiring board, a second printed wiring board and a third printed wiring board. The second printed wiring board is mounted such that one edge of the second printed wiring board abuts on a part mounting surface of the first printed wiring board on which a part is mounted. The third printed wiring board is mounted such that one edge of the third printed wiring board abuts on the part mounting surface of the first printed wiring board.

The second printed wiring board and the third printed wiring board are connected to each other in a state in which a board thickness direction of the second printed wiring board and a board thickness direction of the third printed wiring board are oriented in different directions from each other, about a normal line normal to the part mounting surface. Further, at least one of the second printed wiring board and the third printed wiring board is formed with an antenna pattern.

In such a structure, the first to third printed wiring boards are connected in such a manner that none of any two printed wiring boards are parallel to each other. Therefore, the antenna pattern formed on the second or third printed wiring board can be kept in a standing position relative to the first printed wiring board. That is, the antenna pattern can be mounted on the first printed wiring board in the standing position relative to the first printed wiring board, while suppressing the use of a special structure part other than the printed wiring boards. Further, an antenna board is arranged so as to rising from the first board by connecting three printed wiring boards. Therefore, it is possible to stably maintain the standing position. As such, a special structure part for supporting the antenna board may not be needed.

Hereinafter, embodiments of the present disclosure will be described with reference to the drawings.

1. First Embodiment

[1-1. Overall Structure]

Figure 2:
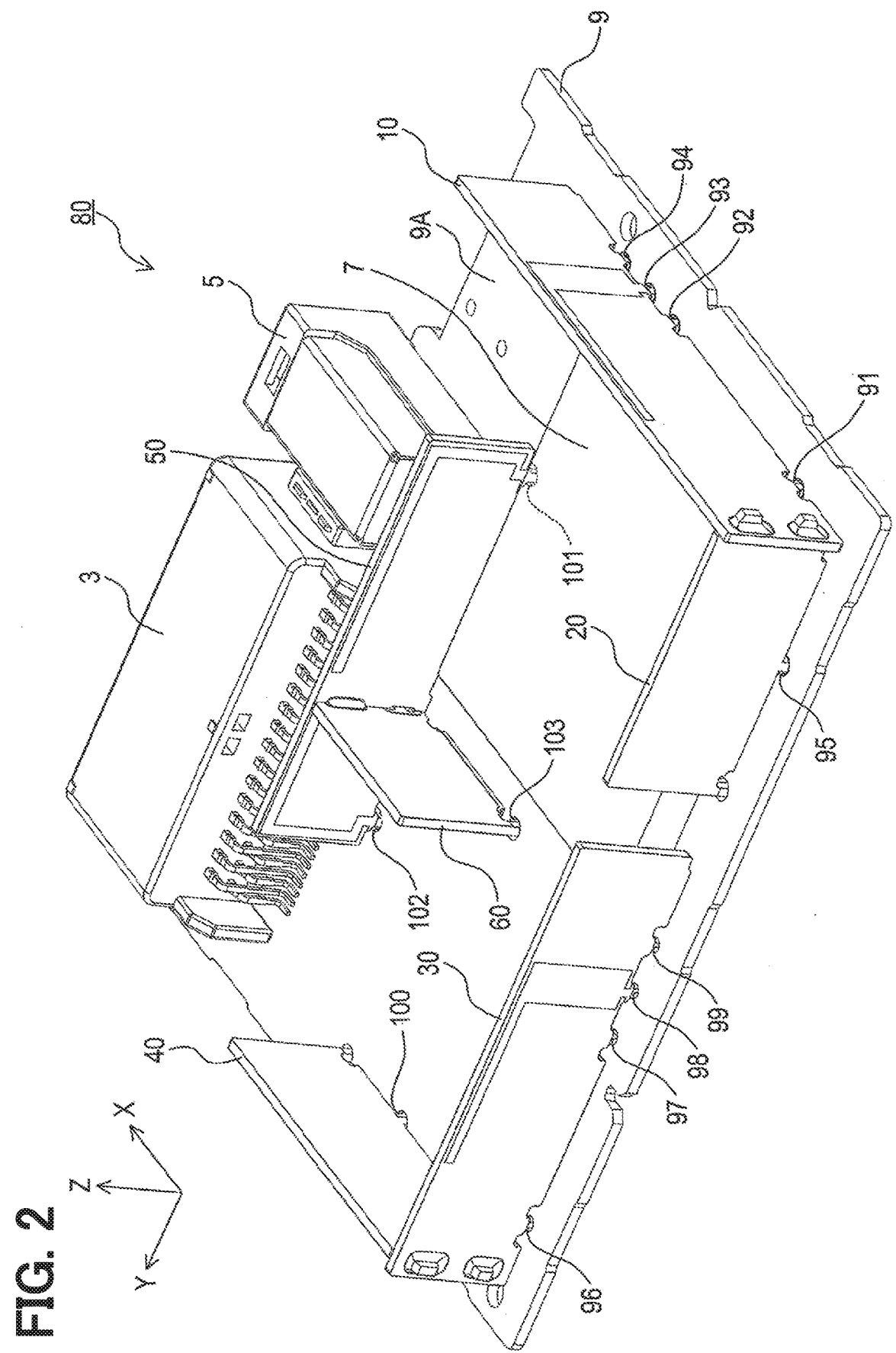
FIG. 2 is a perspective view of an electronic circuit built in the antenna unit.

As shown in FIG. 1, an antenna unit 1 of a first embodiment is an in-vehicle antenna unit. The antenna unit 1 includes a casing 2 having substantially a rectangular parallelepiped shape, and two connectors 3 and 5 exposing from one side surface of the casing 2. As shown in FIG. 2, these two connectors 3 and 5 are surface-mounted (hereinafter, simply referred to as "mounted") on a main board 9, by reflow-soldering, together with IC chips 7, and are accommodated in the casing 2. In addition, six printed wiring boards 10, 20, 30, 40, 50 and 60, which are smaller than a printed wiring board constituting the main board 9, are mounted on the main board 9 by reflow-soldering.

The main board 9 and the two connectors 3 and 5, IC chip 7 and six printed wiring boards 10 to 60, which are mounted on the main board 9, constitute an electronic circuit 80 as the first embodiment. Hereinafter, positional relationships of respective parts will be described using a right-handed coordinate system in which a direction along which the two connectors 3 and 5 expose from the casing 2 is defined as an X direction (that is, +X direction), and a direction that a part-mounting surface 9A of the main board 9, on which parts such as the IC chip 7 and the like are mounted, faces is defined as a Z direction (that is, +Z direction). However, such a coordinate system is merely defined for the convenience of explanation of the positional relationships of the respective parts, and is irrelevant to positions and positional relationships in an actual use. For example, the antenna unit 1 can be used in any position, such as in a position that the +Z direction corresponds to an upward direction or in a position that +X direction corresponds to the upward direction.

As shown in FIG. 1, the casing 2 has an external shape that is substantially a rectangular parallelepiped in which the dimension in the ±Z direction is shorter than the dimension in the ±X direction and the dimension in the ±Y direction, and the dimension in the ±X direction and the dimension in the ±Y direction are substantially the same. As shown in FIG. 2, each of the six printed circuit boards 10 to 60 is a rigid board having a rectangular plate shape, and is mounted on the part mounting surface 9A in such a manner that short-sides of the rectangular shape are parallel to a normal line normal to the part mounting surface 9A. Hereinafter, structures of each of the six printed wiring boards 10 to 60 will be described in detail.

[1-2. Structure of Board Pairs Including Antenna Boards]

Figure 3:
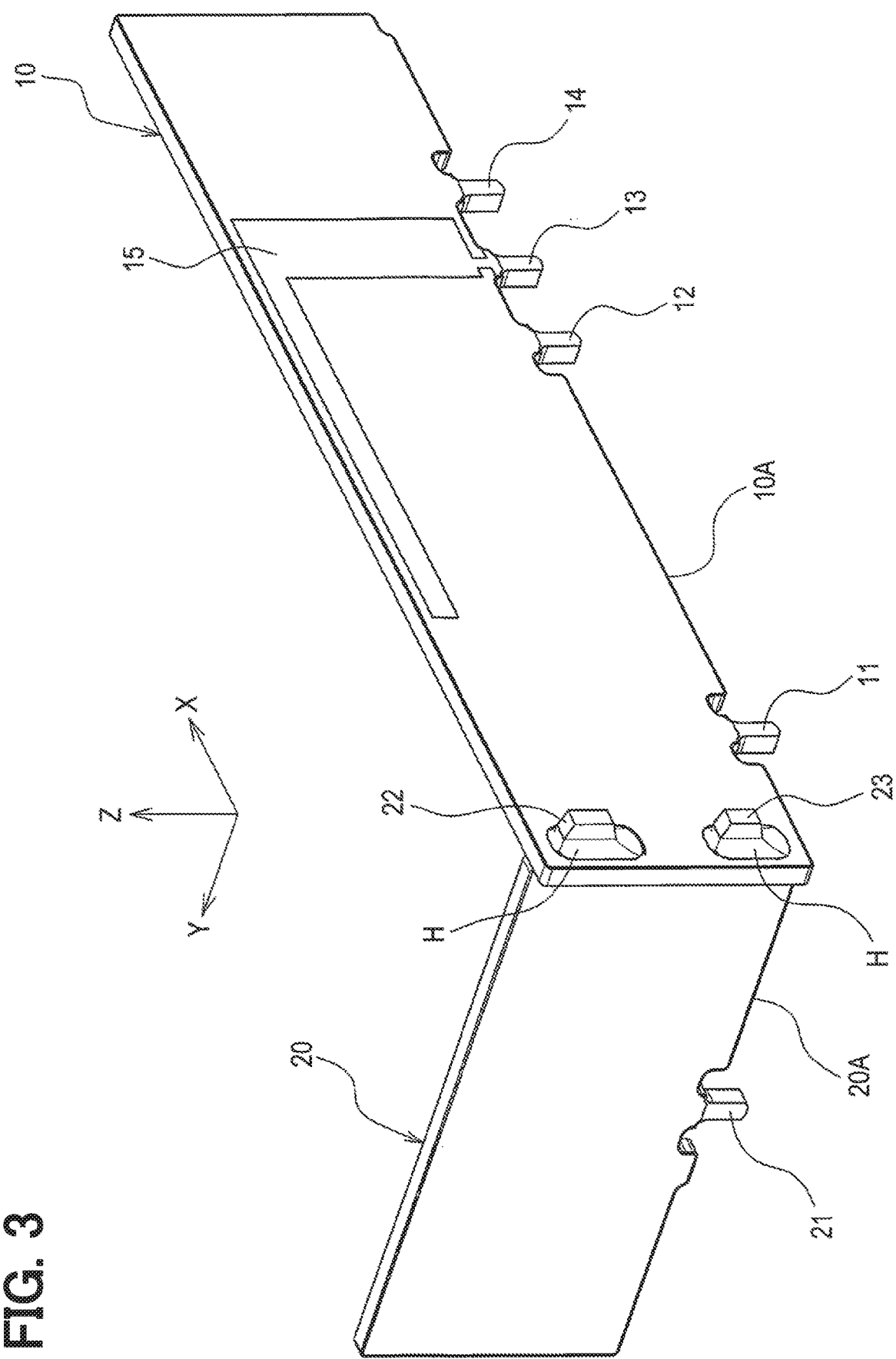
FIG. 3 is a perspective view of a board pair, including an antenna board, in the electronic circuit.

As shown in FIG. 3, the printed wiring board 10, which has the rectangular plate shape, is mounted such that an edge 10A corresponding to one long side of the rectangular shape abuts on the part mounting surface 9A. When being mounted, the printed wiring board 10 is arranged such that the edge 10A extends in the ±X direction.

The printed wiring board 10 has four projections 11, 12, 13 and 14 projecting in the −Z direction on the edge 10A. The four projections 11, 12, 13 and 14 are arranged in the stated order from the end, which is on the −X side when the printed wiring board 10 is mounted. The projection 11 is provided at a position offset toward the −X side on the edge 10A. On the other hand, the three projections 12, 13 and 14 are arranged in a region offset from the center of the edge 10A in the +X direction. The projection 13 is provided so as to serve as an electrode for supplying electric power to an antenna pattern 15 formed on the printed wiring board 10. That is, the printed wiring board 10 serves as an antenna board, and constitutes a board pair (that is, a pair of printed wiring boards) with a printed wiring board 20 as will be described below.

The printed wiring board 20, which has a rectangular plate shape, is mounted such that an edge 20A corresponding to one long side of the rectangular shape abuts on the part mounting surface 9A. When being mounted, the printed wiring board 20 is arranged such that the edge 20A extends in the ±Y direction. The printed wiring board 20 has a projection 21 on the edge 20A, at a position proximate to the center of the edge 20A, and the projection 21 projects in the −Z direction. A short side of the printed wiring board 20 on the −Y side is connected to a short side of the printed wiring board 10 on the −X side through a solder H in the following manner.

Figure 4:
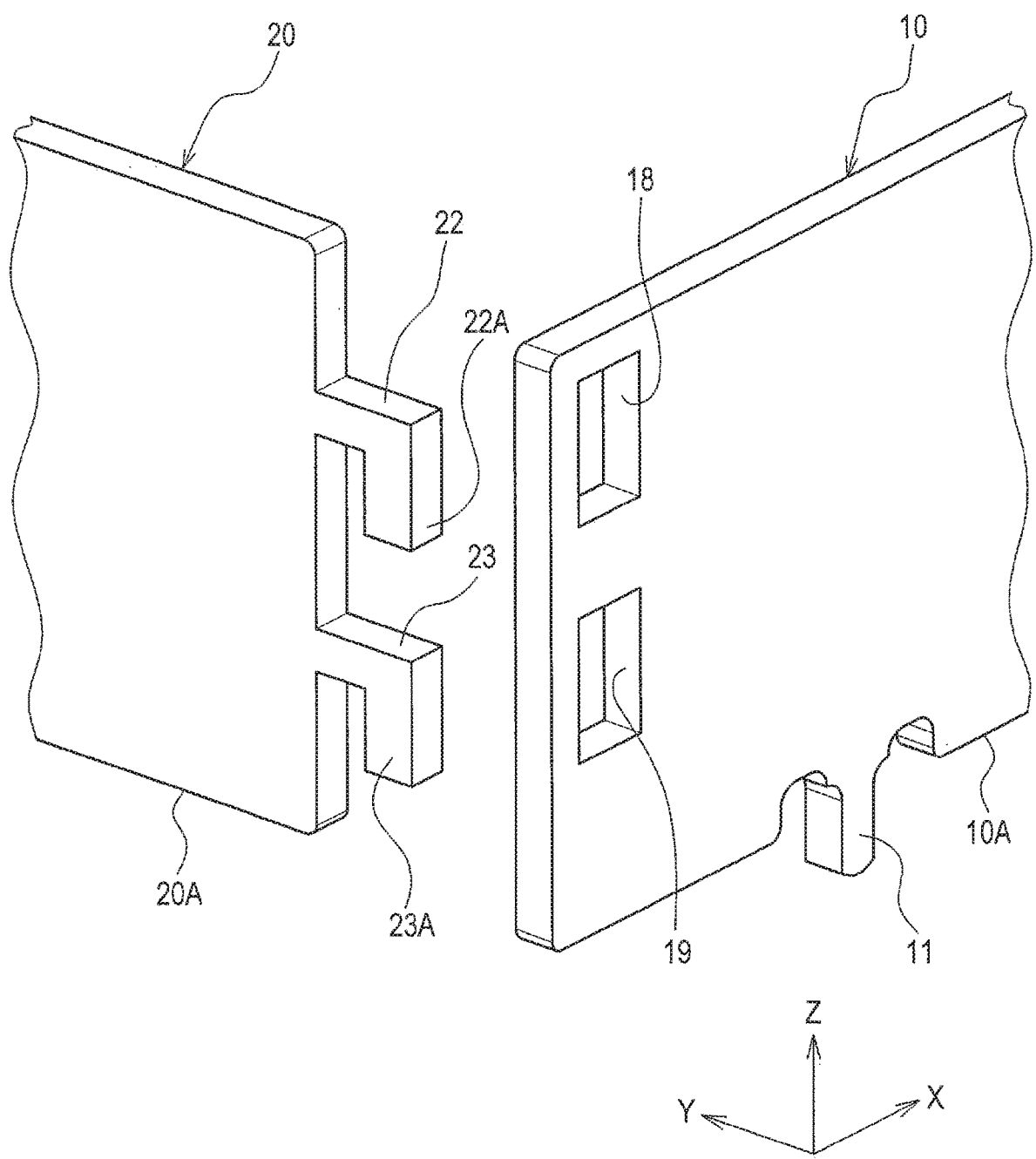
FIG. 4 is a perspective view of a connection structure of printed wiring boards as the board pair.

As shown in FIG. 4, the printed wiring board 10 has two through holes 18 and 19 in an area adjacent to the short side on the −X side. The two through holes 18 and 19 are aligned in the ±Z direction, and each of the two through holes 18 and 19 has a rectangular shape having the long side in the ±Z direction. The printed wiring board 20 has, at the edge on the −Y side, an engagement portion 22 projecting in the −Y direction to be engaged with the through hole 18 while passing through the through hole 18 and an engagement portion 23 projecting in the −Y direction to be engaged with the through hole 19 while passing through the through hole 19. At a tip end of the engagement portion 22, an expanding portion 22A expanding in the −Z direction is formed. Likewise, at a tip end of the engagement portion 23, an expanding portion 23A expanding in the −Z direction is formed.

The dimension of the through hole 18 in the ±Z direction is slightly greater than the dimension of the end of the engagement portion 22, including the expanding portion 22A, in the ±Z direction. Also, the dimension of the through hole 18 in the ±X direction is slightly greater than the dimension of the end of the engagement portion 22, including the expanding portion 22A, in the ±X direction. Likewise, the dimension in the ±Z direction and the dimension in the ±X direction of the through hole 19 are slightly greater than the dimension in the ±Z direction and the dimension in the ±X direction of the end of the engagement portion 23, including the expanding portion 23A, in the ±Z direction and the ±X direction Therefore, the two engagement portions 22 and 23 can pass through the two through holes 18 and 19 in the −Y direction, together with the respective expanding portions 22A and 23A. The positions of the two through holes 18 and 19 are set such that the expanding portion 22A is engaged with a perimeter edge of the through hole 18 on the −Z side, and the expanding portion 23A is engaged with a perimeter edge of the through hole 19 on the −Z side, in a state where the edge 10A and the edge 20A are situated on the same plate after the engagement portions 22 and 23 are passed through the through holes 18 and 19. That is, the two engagement portions 22 and 23, including the respective expanding portions 22A and 23A, are provided as key shapes engaging with the two through holes 18 and 19 from the +Z side.

The two printed wiring boards 10 and 20 are soldered to each other through a solder H in the state where the two expanding portions 22A and 23A are engaged with the perimeter edges of the through holes 18 and 19 on the −Z side, respectively, as described above. Therefore, the two printed wiring boards 10 and 20 are firmly connected to each other. Further, the engagement directions of the two expanding portions 22A and 23A relative to the respective through holes 18 and 19 correspond to the urging direction (that is, in the −Z direction) in which the edge 10A of the printed wiring board 10 is urged against the main board 9 when the two printed wiring boards 10 and 20 are fixed to the main board 9 by reflow-soldering. Therefore, rising of the printed wiring board 10 as the antenna board from the main board 9 is favorably restricted, and thus conduction between the antenna pattern 15 and a pattern (not shown) on the main board 9 can be favorably ensured.

Figure 5:
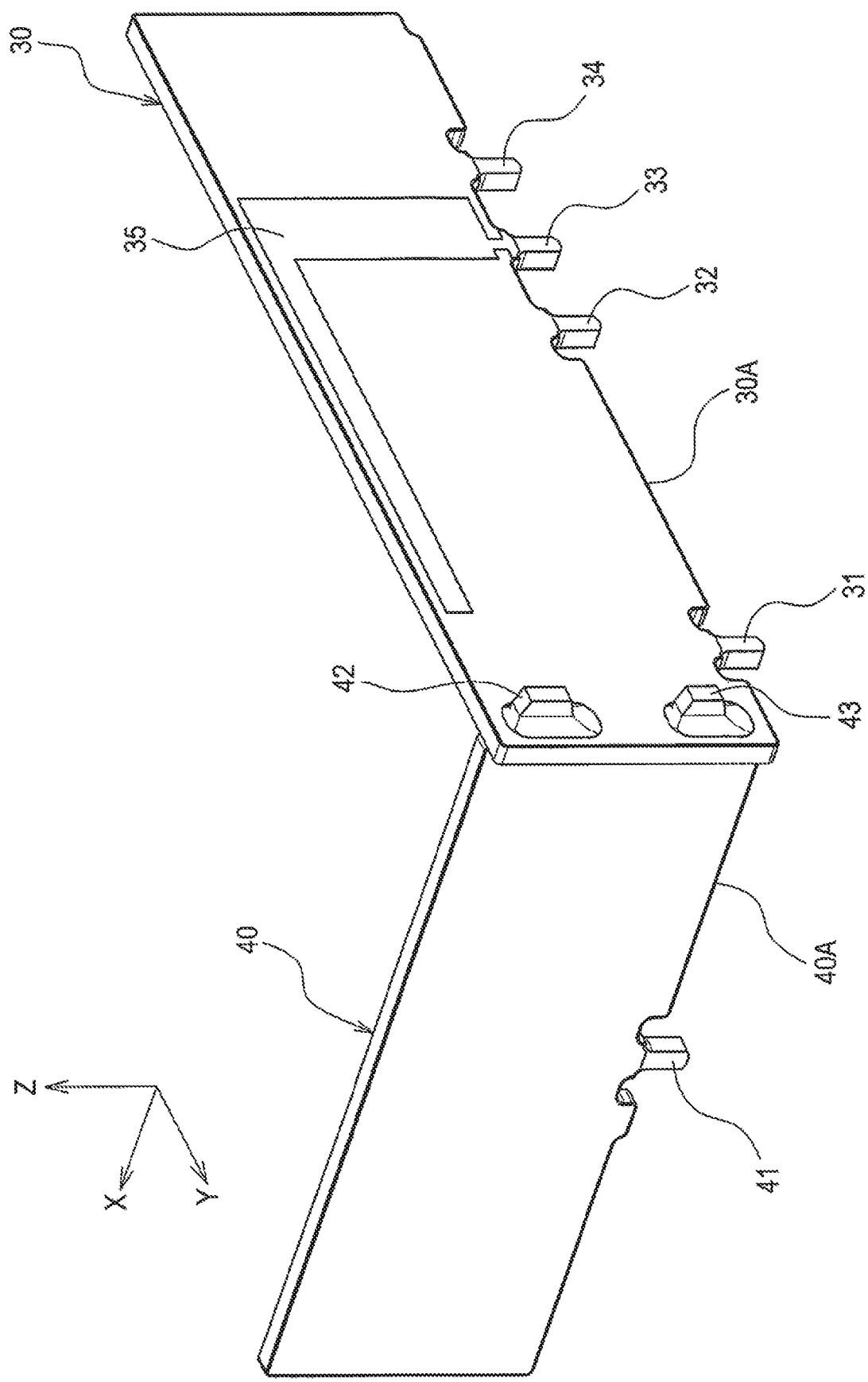
FIG. 5 is a perspective view of another board pair in the electronic circuit.

Next, as shown in FIG. 5, the printed wiring board 30, which has a rectangular plate shape, is mounted such that an edge 30A corresponding to one long side of the rectangular shape abuts on the part mounting surface 9A. When being mounted, the printed wiring board 30 is arranged such that the edge 30A extends in the ±Y direction. The printed wiring board 30 has four projections 31, 32, 33 and 34 on the edge 30A at similar intervals to the four projections 11, 12, 13 and 14 of the printed wiring board 10. Of the four projections 31, 32, 33 and 34, the projection 33 is provided so as to serve as an electrode for supplying electric power to an antenna pattern 35 formed on the printed wiring board 30. That is, the printed wiring board 30 serves an antenna board, and forms the board pair with the following printed wiring board 40.

The printed wiring board 40, which has a rectangular plate shape, is mounted such that an edge 40A corresponding to one long side of the rectangular shape abuts on the part mounting surface 9A. When being mounted, the printed wiring board 40 is arranged such that the edge 40A extends in the ±X direction. The printed wiring board 40 has a projection 41 on the edge 40A, at a position proximate to the center of the edge 40A, projecting in the −Z direction. Similarly to the printed wiring board 20, the printed wiring board 40 also has two engagement portions 42 and 43 in the short side on the −X side. The two engagement portions 42 and 43 are also connected through a solder H in a state of being passed through two through holes (not shown) formed in the printed wiring board 30 in the proximity of the short side on the +Y side. Note that the engagement states between the two through holes of the printed wiring board 30 and the two engagement portions 42 and 43 may be similar to or different from the engagement states between the two through holes 18 and 19 and the two engagement portions 22 and 23.

Figure 6:
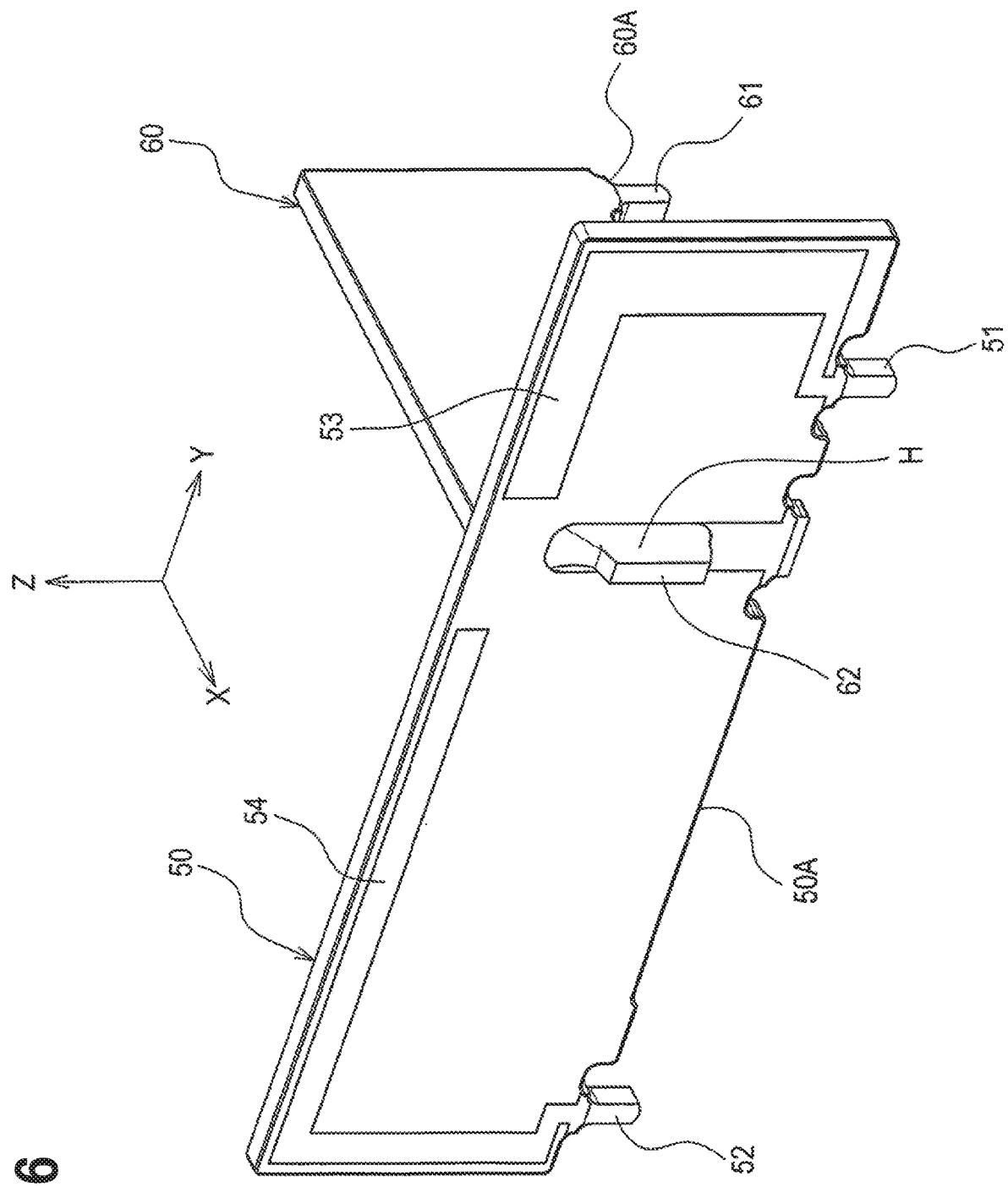
FIG. 6 is a perspective view of further another board pair in the electronic circuit.

As shown in FIG. 6, the printed wiring board 50, which has a rectangular plate shape, is mounted such that an edge 50A corresponding to one long side of the rectangular shape abuts on the part mounting surface 9A. When being mounted, the printed wiring board 50 is arranged such that the edge 50A extends in the ±Y direction. The printed wiring board 50 has two projections 51 and 52 on the edge 50A at opposite ends in the ±Y direction, the two projections 51 and 52 projecting in the −Z direction. The projection 51 is provided so as to serve as an electrode for supplying electric power to an antenna pattern 53 formed on the printed wiring board 50. Further, the projection 52 is provided so as to serve as an electrode for supplying electric power to an antenna pattern 54 formed on the printed wiring board 50. That is, the printed wiring board 50 serves as an antenna board, and forms the board pair with the following printed wiring board 60.

The printed wiring board 60, which has a rectangular plate shape, is mounted such that an edge 60A corresponding to one long side of the rectangular shape abuts on the part mounting surface 9A. When being mounted, the printed wiring board 60 is arranged such that the edge 60A extends in the ±X direction. The printed wiring board 60 has a projection 61 on the edge 60A, at a position proximate to the end on the −X side, the projection 61 projecting in the −Z direction. The printed wiring board 60 has an engagement portion 62 at an edge on the +X side to engage with a through hole (not shown) formed in the printed wiring board 50. This engagement portion is connected to the printed wiring board 50 through a solder H in a state of being passed through the through hole. Note that the engagement states between the through hole of the printed wiring board 50 and the engagement portion 62 may be similar to or different from the engagement state between the through hole 18 or 19 and the engagement portion 22 or 23.

[1-3. Structure of Main Board and Production Process for Antenna Unit]

Figure 7:
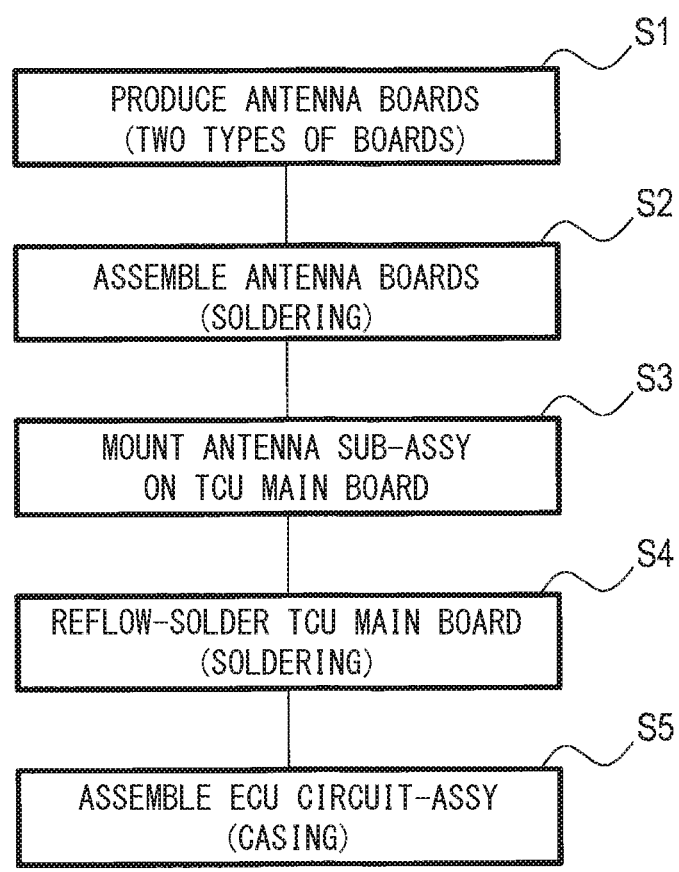
FIG. 7 is a flow chart illustrating a part of a production process of the electronic circuit.

The board pairs, including the antenna boards, with the structures as described above are mounted on the main board 9 by a technique of through hole reflowing (hereinafter, THR). In a production process for producing an antenna unit 1, as shown in FIG. 7, a worker firstly produces, in S1, six printed wiring boards 10 to 60, as basis of the board pairs including the antenna boards as described above. Next, in S2, a worker assembles the six printed wiring boards 10 to 60 into the board pairs by soldering.

Next, in S3, a worker mounts the board pairs assembled in S2 onto the main board 9 (that is, TCU main board). Subsequently, in S4, each of the board pairs is soldered to the main board 9 by reflowing (that is, reflow-assembling). In S5, an electronic circuit 80 is assembled to the casing 2. In this way, the production of the antenna unit 1 is finished. Note that, in FIG. 7, the electronic circuit 80 is indicated as "ECU CIRCUIT-ASSY", and each of the board pairs is indicated as "ANTENNA SUB-ASSY".

In the production process, in S3, the projections 11, 12, 13, 14, 21, 31, 32, 33, 34, 41, 51, 52, and 61 of the respective board pairs are received in the respective through holes 91, 92, 93, 94, 95, 96, 97, 98, 99, 100, 101, 102 and 103 of the main board 9. Note that the respective board pairs have assembly errors. For example, as shown in FIG. 8, although an angle θ defined between the printed wiring board 10 and the printed wiring board 20 about a Z axis is originally 90°, the provability that the angle θ is exactly 90° is not high.

Therefore, in the electronic circuit 80, an inner diameter of the through hole 95 is designed as follows. The mounting location of the printed wiring board 10 is regulated as the projections 11, 12, 13 and 14 are received in the through holes 91, 92, 93 and 94, respectively. Thus, if the angle θ has an error, the position of the projection 21 of the printed wiring board 20 may have an error. For this reason, the inner diameter of the through hole 95 for receiving the projection 21 therein has a margin relative to an outer diameter of the projection 21. Also, the error of the location of the projection 21 increases as a function of distance of the projection 21 from a position (hereinafter, connecting portion) at which the printed wiring board 10 and the printed wiring board 20 are connected to each other.

Figure 8:
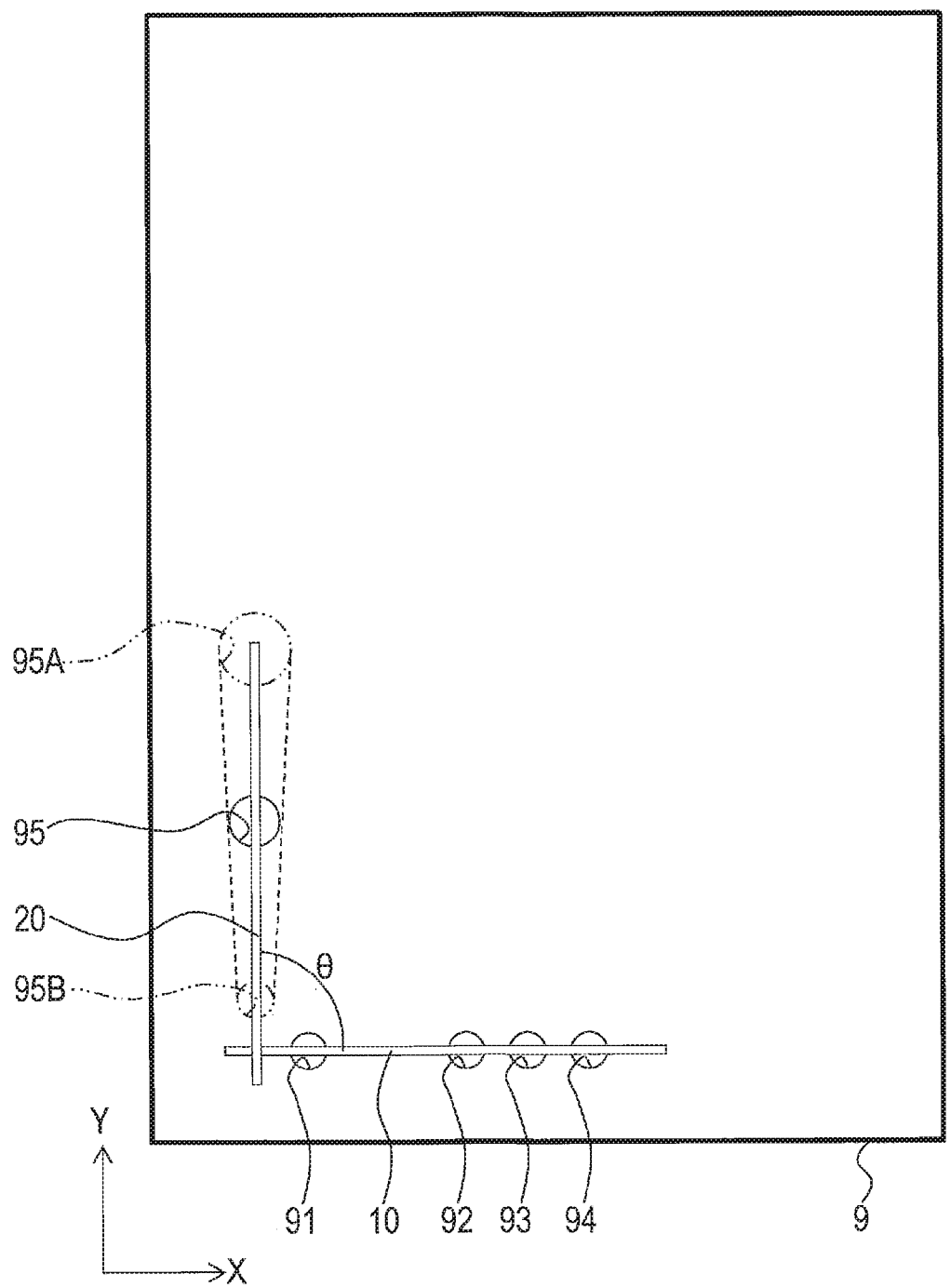
FIG. 8 is a plan view for illustrating arrangement and size of through holes in the electronic circuit.

Therefore, in a case where the projection 21 is provided at a location further separated from the connecting portion, it is preferable to increase the inner diameter as a through hole 95A shown in FIG. 8. On the other hand, in a case where the projection 21 is provided at a location closer to the connecting portion, it may be possible to further reduce the inner diameter as a through hole 95B shown in FIG. 8. As described above, in the present embodiment, the inner diameter of the through hole 95 is designed to increase as a function of distance from the connecting portion.

[1-4. Effects]

In the first embodiment as described hereinabove, the following effects will be achieved.

(1A) In the first embodiment, since the printed wiring board 10, the printed wiring board 20 and the main board 9 are connected to one another in such a manner that all of any two wiring boards are not parallel to each other, the antenna pattern formed in the printed wiring board 10 can be kept in the standing position relative to the main board 9. That is, while suppressing the use of special structure part other than the printed wiring boards, the antenna pattern 15 can be surface-mounted on the main board 9 in the standing position standing up relative to the main board 9. Further, the printed wiring board 10 as the antenna board is set in the standing position relative to the main board 9 by connecting three printed wiring boards (that is, the main board 9 and the two printed wiring boards 10 and 20). Therefore, it is possible to keep the standing position, and it is not necessary a specific structure part for supporting the printed wiring board 10 as the antenna board (for example, a structure part other than the printed wiring boards).

Also for the other board pairs, the similar effects will be achieved as follows. The printed wiring board 30 as the antenna board is stably kept in the standing position relative to the main board 9 by connecting three printed wiring boards (that is, the main board 9 and the two printed wiring boards 30 and 40), and the specific structure part is not necessary. The printed wiring board 50 as the antenna board is stably kept in the standing position relative to the main board 9 by connecting three printed wiring boards (that is, the main board 9 and the two printed wiring boards 50 and 60), and the specific structure body is not necessary.

(1B) The six printed wiring boards 10 to 60 are mounted in the standing position relative to the main board 9 as the projections 11 to 61 are fitted in the through holes 91 to 103. Therefore, the three printed wiring boards 10, 30 and 50 as the antenna boards can be further stably kept in the standing position. In addition, each of the projections 11 to 52 is formed at a position other than ends of each edge 10A to 50A (for example, other than a position where each of the projections 11 to 52 approaching the end point of each edge 10A to 50A). Therefore, even if the printed wiring boards constituting the board pairs have assembly errors, as described above, it is less likely that the assembly errors will be reflected as position errors of the projections 11 to 52, as compared with the case where the projections 11 to 52 are formed at the ends of the edges 10A to 50A. As such, an occurrence of a situation where the projections 11 to 52 cannot be received in the through holes 91 to 103 due to the errors will be suppressed.

(1C) In the first embodiment, it is designed that the inner diameter of the through hole 95 increases as a function of distance from the connecting portion between the two printed wiring boards 10 and 20. In this case, even if the two printed wiring boards 10 and 20, which form the board pair, have an assembly error as described hereinabove, the occurrence of the situation where the projection 21 cannot be received in the through hole 95 due to the error is further favorably suppressed.

(1D) The two engagement portions 22 and 23 of the printed wiring board 20 are respectively soldered to the two through holes 18 and 19 formed in the printed wiring board 10 in the state of passing through the two through holes 18 and 19. Therefore, the connected state of the two printed wiring boards 10 and 20 can be further strengthened. For example, even if the solder H is melted in the step of reflow-soldering in S4, separation of the two printed wiring boards 10 and 20 can be restricted.

(1E) In addition, the two engagement portions 22 and 23 have, at the tip ends thereof, the expanding portions 22A and 23A expanding in the direction toward the edge 20A of the printed wiring board 20. The engagement portions 22 and 23 are, respectively, soldered to the through holes 18 and 19 in the states where the expanding portions 22A and 23A are engaged with the perimeter edges on the −Z side of the two through holes 18 and 19 (that is, the perimeter edges of the through holes 18 and 19 adjacent to the main board 9). Therefore, the rising of the printed wiring board 10 in the direction separating from the main board 9 (that is, in the +Z direction) can be further favorably suppressed. Accordingly, the conduction between the pattern (not shown) of the main board 9 and the antenna pattern 15 can be further favorably ensured.

2. Second Embodiment

[21. Difference from First Embodiment]

The basic structure of a second embodiment is similar to the first embodiment, and thus differences will be mainly described while omitting the descriptions of the common structure. An electronic circuit of the second embodiment is different from the first embodiment on the point of having a board pair including a printed wiring board 210 as an antenna board, as shown in FIG. 9.

Figure 9:
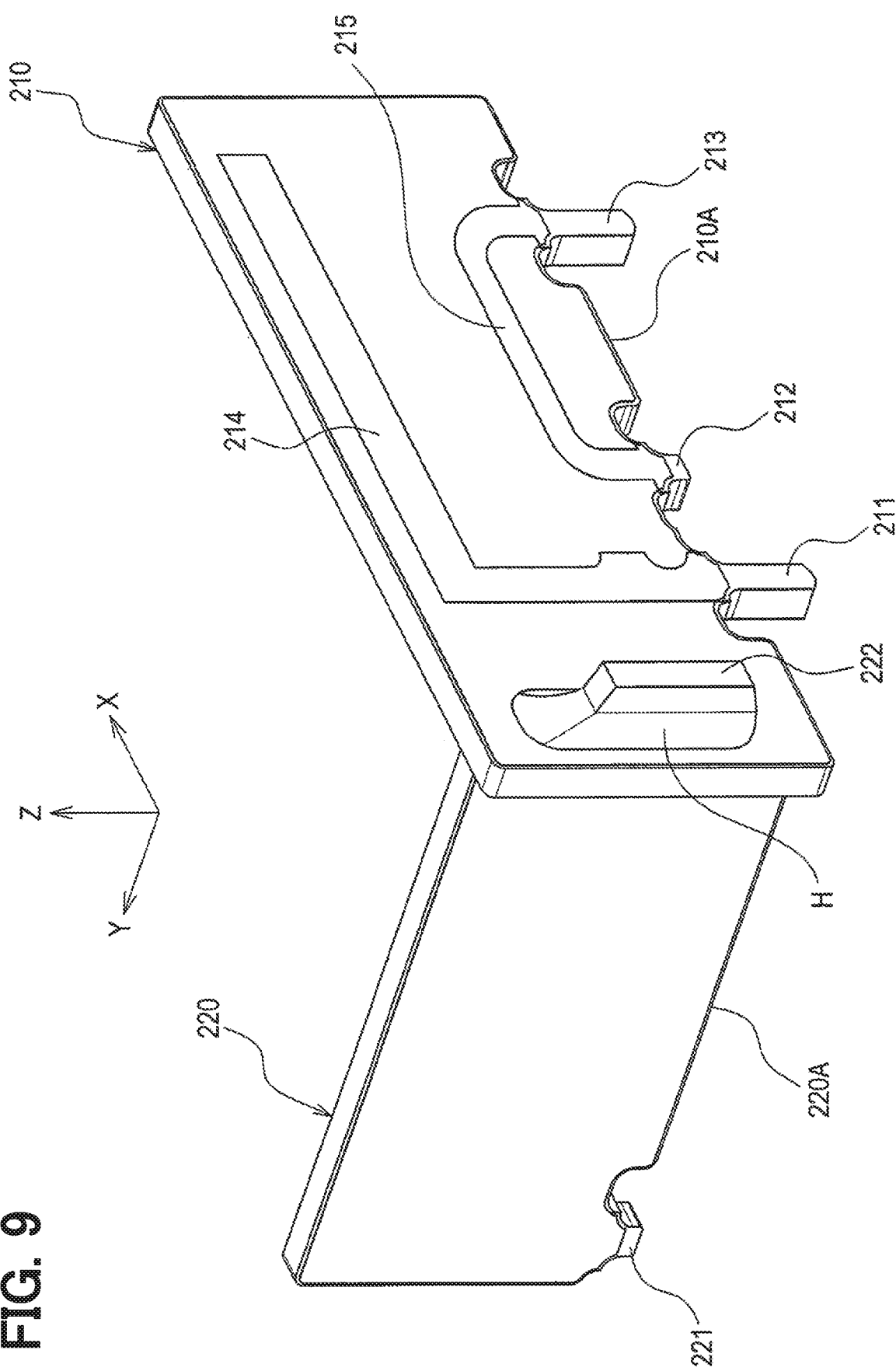
FIG. 9 is a perspective view of a board pair according to a second embodiment.

As shown in FIG. 9, the printed wiring board 210, which has a rectangular plate shape, is mounted such that an edge 210A corresponding to one long side of the rectangular shape abuts on the part mounting surface 9A. The printed wiring board 210 has three projections 211, 212, and 213 on the edge 210A, the three projections 211, 212 and 213 projecting in the −Z direction. The projection 211 is provided so as to serve as an electrode for supplying electric power to an antenna pattern 214 formed on the printed wiring board 210. The projections 211 and 213 are provided so as to serve as electrodes that are shorted via a pattern 215 formed on the printed wiring board 210.

A printed wiring board 220, which makes the board pair with the printed wiring board 210, has a rectangular plate shape, and is mounted such that an edge 220A corresponding to one long side of the rectangular shape abuts on the part mounting surface 9A. The printed wiring board 220 has a projection 221 projecting in the −Z direction on the edge 220A. The printed wiring board 220 has an engagement portion 222 on the edge on a side being connected to the printed wiring board 210, the engagement portion 222 being engaged with a through hole (not shown) formed in the printed wiring board 210. The engagement portion 222 is soldered to the printed wiring board 210 by a solder H in a state of being passed through the through hole. Note that the engagement state of the engagement portion 222 and the through hole of the printed wiring board 210 may be similar to or different from the engagement state between the through hole 18 or 19 and the engagement portion 22 or 23.

[2-2. Effects]

In the second embodiment as described hereinabove, the following effect will be achieved, in addition to the effects (1A) and (1D) of the first embodiment described hereinabove.

(2A) In the second embodiment, the printed wiring board 210 as the antenna board has the two projections 212 and 213 functioning as the electrodes shorted via the pattern 215 formed in the printed wiring board 210. In this case, as patterns for allowing electric conduction between any two pins of the connector 3 or 5 and the two projections 212 and 213 are formed on the part mounting surface 9A, it is possible to know whether or not the edge 210A is separated from the part mounting surface 9A by inspecting the conduction state of the two pins.

As the second embodiment, in the case where the main board 9 on which the printed wiring board 210 as the antenna board is accommodated in the casing 2, it was not easy to know whether or not the printed wiring board 210 is separated from the part mounting surface 9A after the accommodation. Therefore, also in a situation where reception of radio waves is poor, it was difficult to know whether the cause is due to the antenna pattern 214 or the like or due to the antenna pattern 214 failing to contact with the pattern formed on the part mounting surface 9A. In the second embodiment, on the other hand, it is possible to know whether the edge 210A rises up from the part mounting surface 9A, that is, whether the antenna pattern 214 is in contact with the pattern formed on the part mounting surface 9A, by inspecting the conduction state of the two pins.

3. Third Embodiment

[3-1. Difference from First Embodiment]

The basic structure of a third embodiment is similar to the first embodiment, and thus differences will be mainly described while omitting the descriptions of the common structure. In the first embodiment, the printed wiring board 10 as the antenna board has the two rectangular through holes 18 and 19 aligned in the ±Z direction. On the other hand, an electronic circuit of the third embodiment is different from the first embodiment on the point of having a printed wiring board 310 as an antenna board as shown in FIG. 10.

Figure 10:
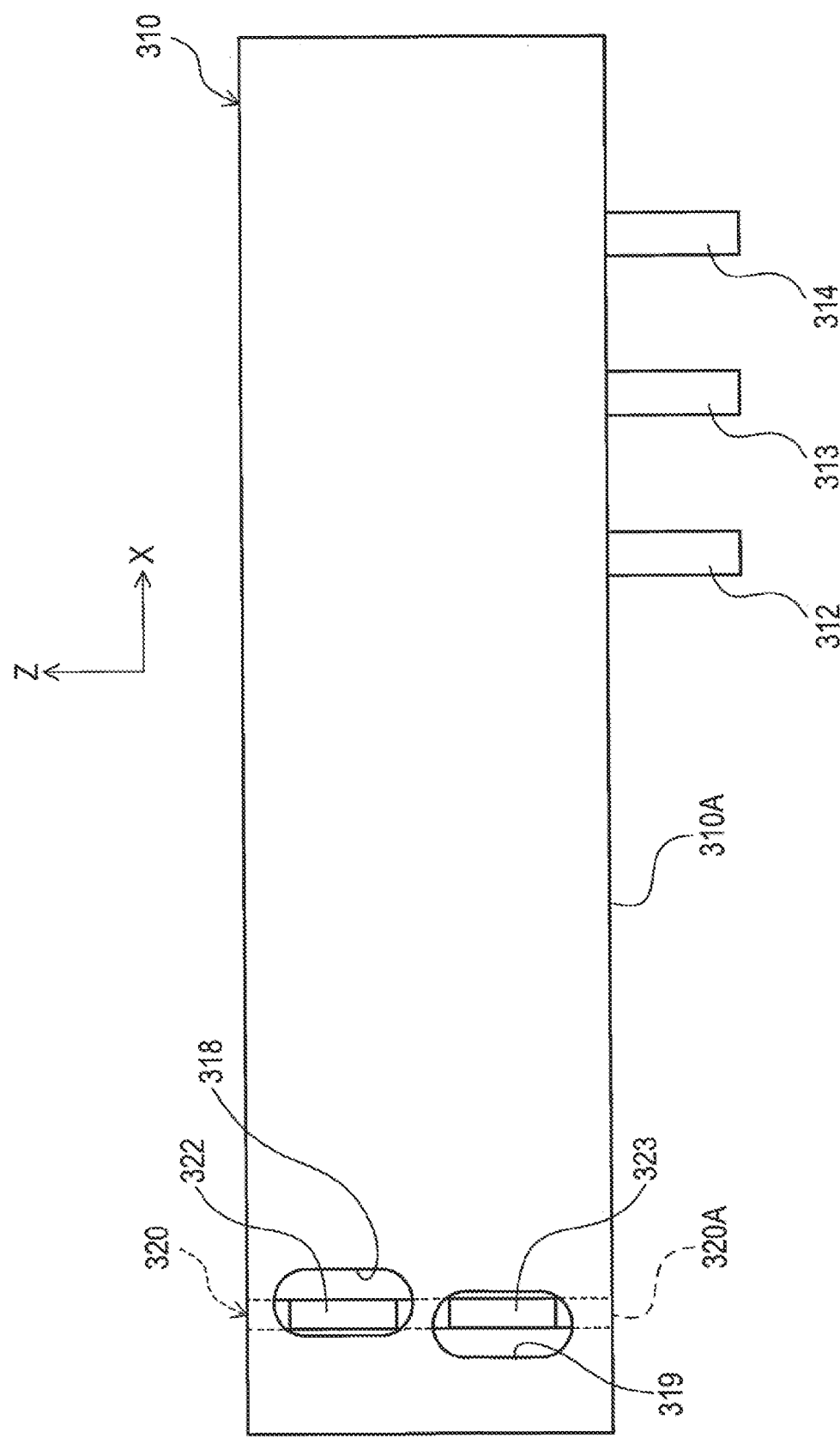
FIG. 10 is a schematic view for illustrating a connection mechanism of a board pair according to a third embodiment.

As shown in FIG. 10, the printed wiring board 310, which has a rectangular plate shape, is mounted such that an edge 310A corresponding to one long side of the rectangular shape abuts on the part mounting surface 9A. The edge 310A may be arranged to extend in any direction on the part mounting surface 9A. Hereinafter, however, it will be described as a case where the printed wiring board 310 is arranged in such a manner that the edge 310A extends in ±X direction, similarly to the printed wiring board 10.

The printed wiring board 310 has three projections 312, 313 and 314 projecting in the −Z direction on the edge 310A, at the similar positions to the three projections 12, 13 and 14 of the printed wiring board 10. At least one of the three projections 312 to 314 is provided so as to serve as an electrode for supplying electric power to the antenna pattern (not shown) formed on the printed wiring board 310.

A printed wiring board 320 forms a board pair with the printed wiring board 310. The printed wiring board 320 has a rectangular plate shape, and is mounted on the part mounting surface 9A such that an edge 320A corresponding to one long side of the rectangular shape abuts on the part mounting surface 9A. Further, the printed wiring board 320 has two engagement portions 322 and 323 at the edge on a side to be connected to the printed wiring board 310. The two engagement portions 322 and 323 are arranged in the ±Z direction to be engaged with two through holes 318 and 319 formed in the printed wiring board 310. The two engagement portions 322 and 323 do not have expanding portions, and each of the two engagement portions 322 and 323 has a generally rectangular parallelepiped shape as a whole. The two through holes 318 and 319 each have an elliptical shape having a major axis in the ±Z direction.

Figure 11:
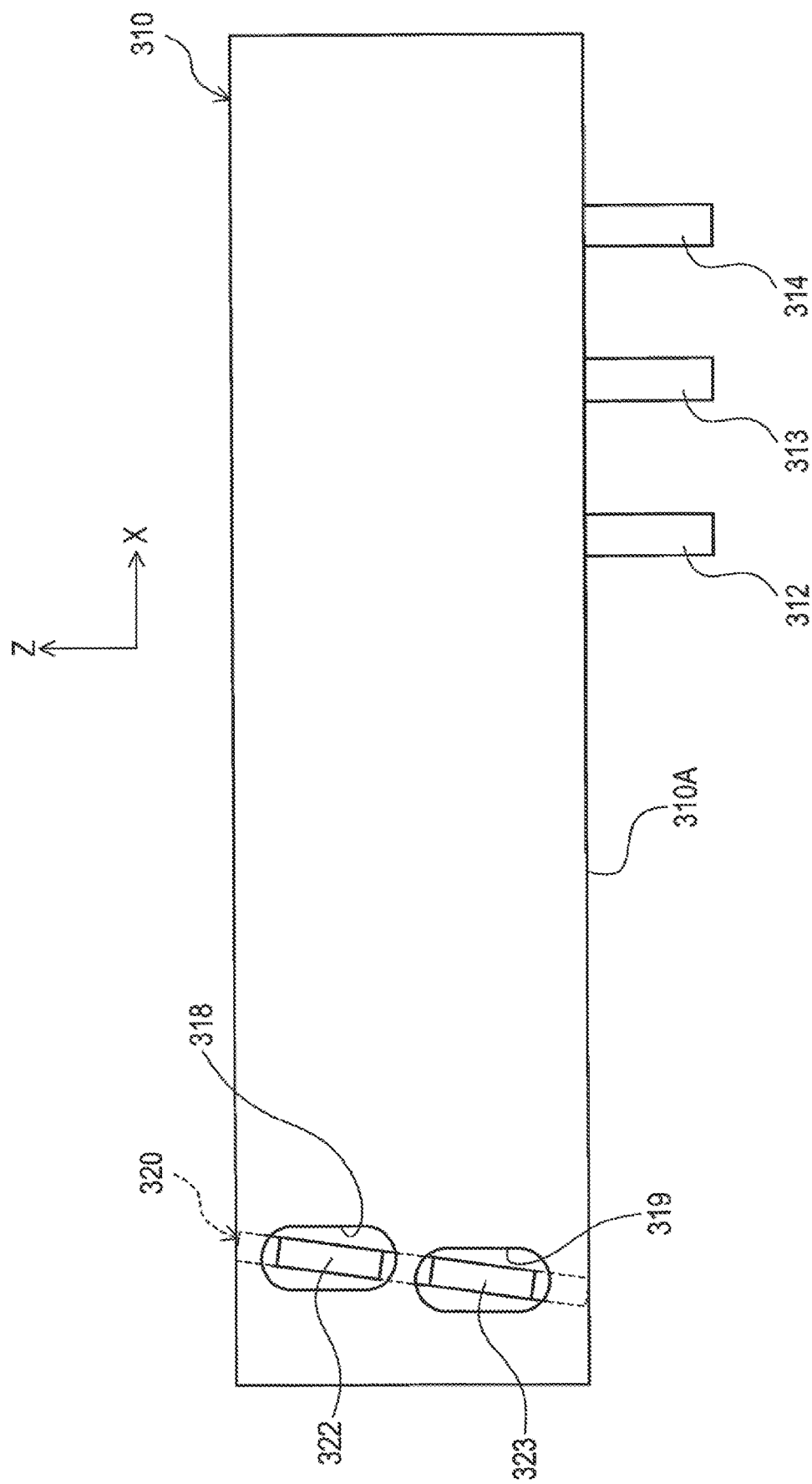
FIG. 11 is a schematic view for illustrating an effect achieved by the connection mechanism.

The inner perimeter of the through hole 318 has a size that encompasses the outer perimeter of the engagement portion 322 (that is, an outer perimeter in a ZX cross section). Likewise, the inner perimeter of the through hole 319 has a size that encompasses the outer perimeter of the engagement portion 323. For this reason, the two engagement portions 322 and 323 are displaceable within the two through holes 318 and 319, respectively, as shown in FIGS. 10 and 11. In this case, therefore, the two through holes 318 and 319 are designed to positions such that the two engagement portions 322 and 323 are aligned in the ±Z direction in a situation where the engagement portion 322 is in contact with an inner wall of the through hole 318 on the −X side and the engagement portion 323 is in contact with an inner wall of the through hole 319 on the +X side, as shown in FIG. 10. The two engagement portions 322 and 323 are soldered to the printed wiring board 310 in the state where the engagement portion 322 is in contact with the inner wall of the through hole 318 on the −X side, and the engagement portion 323 is in contact with the inner wall of the through hole 319 on the +X side.

[3-2. Effects]

In the third embodiment as described hereinabove, the following effects will be achieved, in addition to the effects (1A) and (1D) of the above-described first embodiment.

(3A) In the third embodiment, as shown in FIG. 10, the two engagement portions 322 and 323 are soldered to the printed wiring board 310 in the state where the engagement portion 322 is in contact with the inner wall of the through hole 318 on the −X side, and the engagement portion 323 is in contact with the inner wall of the through hole 319 on the +X side. Therefore, if by any chance the solder used for soldering the engagement portions 322 and 323 to the through holes 318 and 319 is melted in the step of reflow-soldering, the edge of the printed wiring board 320 on the +Z side falls toward the +X direction (that is, in the direction separating from the casing 2), as shown in FIG. 11.

As the third embodiment, in the case where the two through holes 318 and 319 are designed to have the inner perimeters that loosely encompass the outer perimeter 322 and 323 of the two engagement portions 322 and 323, which pass through the two through holes 318 and 319, the two engagement portions 322 and 323 can be easily inserted into the two through holes 318 and 319, respectively. However, in the case where the parts, such as the board pairs in which plural printed wiring boards are mutually soldered to each other, are mounted on another printed wiring board and the reflow-soldering is performed, there is a possibility that the solder used for soldering the fabrications of the board pairs or the like will be melted.

In such a case, it is preferable to suppress displacement of the printed wiring boards of the board pairs in undesired directions. In the third embodiment, because of the structure described hereinabove, even if the solder connecting the two engagement portions 322 and 323 of the printed wiring board 320 with the printed wiring board 310 is melted, it is possible to suppress the printed wiring board 320 from displacing toward the casing 2.

4. Fourth Embodiment

[4-1. Difference from First Embodiment]

The basic structure of a fourth embodiment is similar to the first embodiment, and thus differences will be mainly described while omitting the descriptions of the common structure. In the first embodiment, the printed wiring board 10 as the antenna board has the two through holes 18 and 19, and the printed wiring board 20 has the two engagement portions 22 and 23. On the other hand, an electronic circuit of the fourth embodiment is different from the first embodiment on the point that a printed wiring board 410 as the antenna board has one engagement portion 413, and a printed wiring board 420 has a through hole 423, as shown in FIG. 12.

Figure 12:
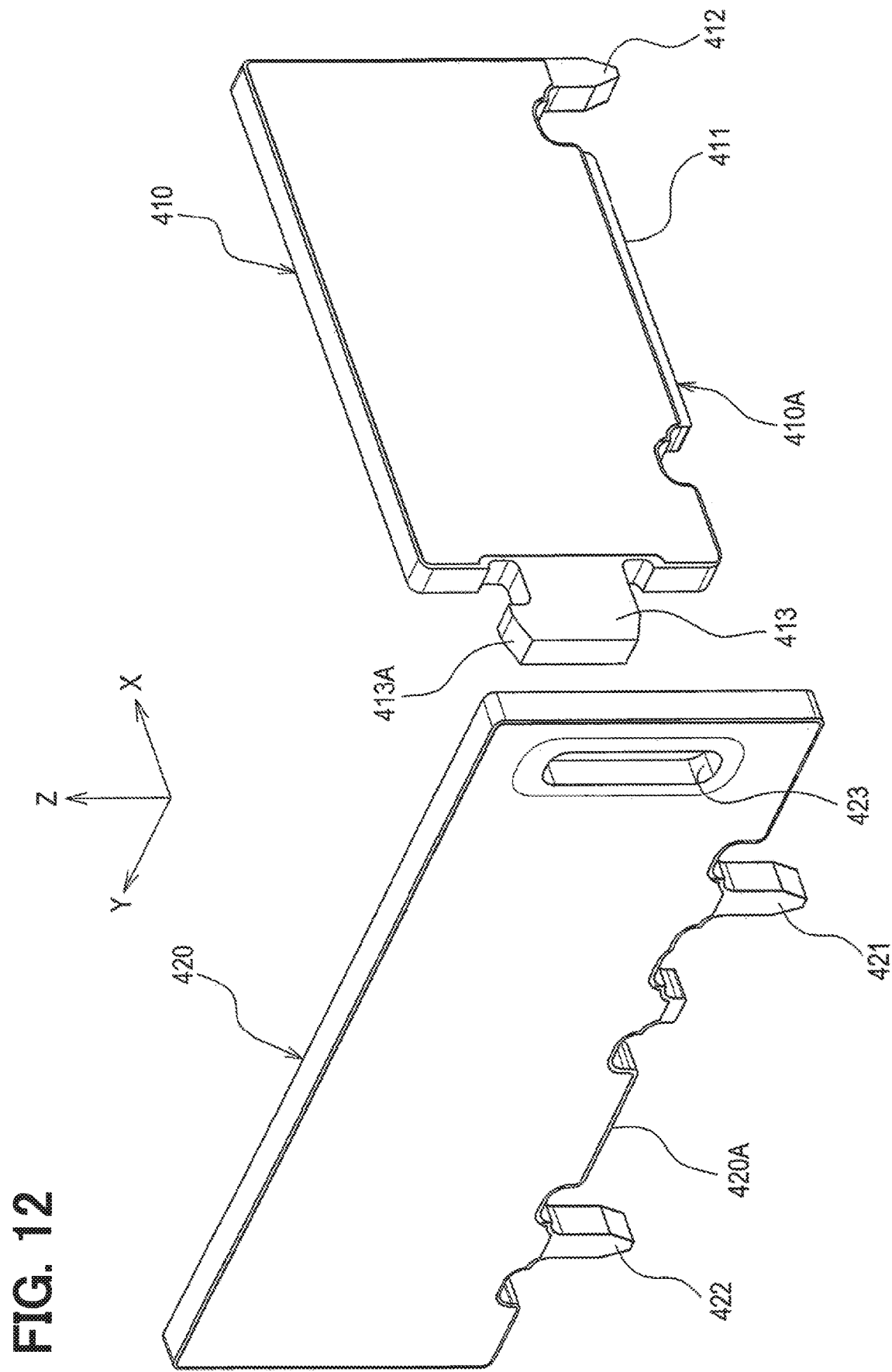
FIG. 12 is a perspective view for illustrating a connection mechanism of printed wiring boards according to a fourth embodiment.

As shown in FIG. 12, the printed wiring board 410, which has a rectangular plate shape, is mounted such that an edge 410A corresponding to one long side of the rectangular shape abuts on the part mounting surface 9A. The edge 410A may be arranged to extend in any direction on the part mounting surface 9A. Hereinafter, however, it will be described as a case where the printed wiring board 410 is arranged in such a manner that the edge 410A extends in ±X direction, similarly to the printed wiring board 10.

The printed wiring board 410 has a terminal 411 of a so-called surface mounting type (hereinafter SMT) at a middle portion on the edge 410A. The terminal 411 has a planar shape having a length of one half or more of the edge 410A and opposing to the part mounting surface 9A. The printed wiring board 410 has a projection 412 at an end of the edge 410A on the +X side, the projection 412 projecting in the −Z direction. At least one of the terminal 411 and the projection 412 is provided so as to serve as an electrode for supplying electric power to an antenna pattern (not shown) formed on the printed wiring board 410.

A printed wiring board 420 forms the board pair with the printed wiring board 410. The printed wiring board 420 has a rectangular plate shape, and is mounted on the part mounting surface 9A such that an edge 420A corresponding to one long side of the rectangular shape abuts on the part mounting surface 9A. Further, the printed wiring board 420 has two projections 421 and 422 on the edge 420A. The printed wiring board 420 has a through hole 423 at an end on a side to be connected to the printed wiring board 410 (that is, on the −Y side). The through hole 423 has an elliptical shape having a major axis in the ±Z direction.

The printed wiring board 410 has an engagement portion 413 at an edge on the −X side, the engagement portion 413 projecting in the −X direction. The engagement portion 413 is provided to pass through the through hole 423 and to be engaged with the through hole 423. Further, the engagement portion 413 has an expanding portion 413A expanding in the +Z direction at a tip end. The dimension of the through hole 423 in the ±Z direction is slightly greater than the dimension of the engagement portion 413, including the expanding portion 413A at the tip end, in the ±Z direction. Also, the dimension of the through hole 423 in the ±Y direction is slightly greater than the dimension of the engagement portion 413, including the expanding portion 413A at the tip end, in the ±Y direction.

Therefore, the engagement portion 413 can pass through the through hole 423 in the −X direction, together with the expanding portion 413A. The position of the through hole 423 is set in such a manner that the expanding portion 413A engages with a perimeter edge of the through hole 423 on the +Z side when the edge 410A and the edge 420A are located on the same plane after the engagement portion 413 passes through the through hole 423. That is, the engagement portion 413, including the expanding portion 413A, has a key shape that engages with the through hole 423 on the −Z side.

The two printed wiring boards 410 and 420 are soldered to each other in a state where the expanding portion 413A is engaged with the perimeter edge of the through hole 423 on the +Z side. Therefore, the two printed wiring boards 410 and 420 are firmly connected to each other. Further, the engagement direction of the expanding portion 413A with respect to the through hole 423 corresponds to the direction in which the edge 410A of the printed wiring board 410 is urged against the main board 9 (that is, in the −Z direction) when the two printed wiring boards 410 and 420 are reflow-soldered to the main board 9. Therefore, the rising of the printed wiring board 410 as the antenna board from the main board 9 is favorably restricted. Moreover, the conduction between the pattern (not shown) on the main board 9 and the antenna pattern (not shown) on the printed wiring board 410 can be favorably ensured.

[4-2. Effects]

In the fourth embodiment as described hereinabove, the effects (1A), (1D), and (1E) of the above-described first embodiment will be achieved.

5. Other Embodiments

The embodiments for implementing the present disclosure have been described hereinabove. However, the present disclosure is not limited to the embodiments described hereinabove, but may be modified in various other ways.

(5A) In each of the embodiments described hereinabove, the printed wiring boards forming each board pair are connected to each other by means of the engagements of the through hole(s) and the engagement portion(s). However, the connection between the printed wiring boards forming the board pair is not limited to the above example. For example, the printed wiring boards forming the board pair may be soldered to each other in the state where the edges thereof are abutted onto each other. As another example, a notch may be formed on an edge of the antenna board opposite to the edge abutting on the main board, and an engagement portion formed on another printed wiring board may be engaged on the north in the direction toward the main board. Also in such a case, it is possible to restrict the rising of the antenna board from the main board by means of the above-described engagement.

(5B) In each of the embodiments described hereinabove, the respective printed wiring boards are connected in such a manner that the plate thickness directions of the two printed wiring boards, which form the board pair, are oriented in different directions by 90° about the Z axis (that is, the normal line to the part mounting surface 9A). However, the angle defined between the printed wiring boards connected to each other is not limited to the above described angle. The printed wiring boards, which form the board pair, can be connected to each other as long as the plate thickness directions thereof are different to each other about the normal line, and may be connected to each other so as to define any angle, such as an acute angle or an obtuse angle.

(5C) In each of the embodiments described hereinabove, the electrode in the form of THR in which the electrode is provided by the projecting sticking into the main board is mainly used. However, the form of the electrode is not limited to the above described example. The electrode in the form of SMT may be mainly used. Further, the power supply to the antenna patter may be realized by a cable (that is, an antenna).

(5D) In each of the embodiments described hereinabove, the projection(s) formed in the printed wiring board such as the antenna board is inserted into the through hole(s) formed in the main board. However, the location to which the projection is inserted is not limited to the above described example. The projection formed on the printed wiring board such as the antenna board may be inserted into a recess (that is, a bottomed hole) formed in the main board.

(5E) In each of the embodiments described hereinabove, the electronic circuit is used for the in-vehicle antenna unit. However, the use of the electronic circuit is not limited to the example described hereinabove. The electronic circuit can be used for a portable device such as a tablet terminal, or for a non-portable device.

(5F) In the embodiments described hereinabove, multiple functions provided by one component may be realized by multiple components, or one function provided by one component may be realized by multiple components. Alternatively, multiple functions provided by the multiple components may be realized by one component, or one function provided by multiple components may be realized by one component. Further, a part of components of the above described embodiment(s) may be omitted. Furthermore, at least a part of structures of the embodiment(s) described hereinabove may be added to or replaced with a structure of another embodiment described hereinabove.

Note that, in each of the embodiments described hereinabove, the main board 9 corresponds to a first printed wiring board. Each of the printed wiring boards 10, 30, 50, 210, 310, 420 corresponds to a second printed wiring board. Each of the printed wiring boards 20, 40, 60, 220, 320, 410 corresponds to a third printed wiring board. Each of the through holes 91, 92, 93, 94, 95, 96, 97, 98, 99, 100, 101, 102, and 103 corresponds to a hole. Of the through holes 91, 92, 93, 94, 95, 96, 97, 98, 99, 100, 101, 102, and 103, four through holes 91, 92, 93 and 94 correspond to location regulation portions.

What is claimed is:

1. An electronic circuit comprising:
   a first printed wiring board having a part mounting surface on which a part is mounted;
   a second printed wiring board mounted on the first printed wiring board such that one edge of the second printed wiring board abuts on the part mounting surface; and
   a third printed wiring board mounted on the first printed wiring board such that one edge of the third printed wiring board abuts on the part mounting surface, wherein
   the second printed wiring board and the third printed wiring board are connected to each other in a state where a plate thickness direction of the second printed wiring board and a plate thickness direction of the third printed wiring board are oriented in different directions from each other about a normal line to the part mounting surface, and
   at least one of the second printed wiring board and the third printed wiring board is provided with an antenna pattern.

2. The electronic circuit according to claim 1, wherein
   the first printed wiring board is provided with one of a hole and a recess,
   the second printed wiring board is provided with a projection on the one edge at a position other than ends of the one edge, and
   the projection of the second printed wiring board is received in the one of the hole and the recess of the first printed wiring board.

3. The electronic circuit according to claim 1, wherein
   the first printed wiring board is provided with a location regulation portion to regulate a mounting location of the second printed wiring board relative to the first printed wiring board,
   the third printed wiring board is provided with a projection on the one edge of the third printed wiring board,
   the first printed wiring board is further provided with one of a hole and a recess that receives the projection of the third printed wiring board in a state where the second printed wiring board and the third printed wiring board are connected to each other and the second printed wiring board is arranged at the mounting location regulated by the location regulation portion, wherein
   the one of the hole and the recess of the first printed wiring board is configured to have an inner diameter that increases as a function of distance from a connecting portion between the second printed wiring board and the third printed wiring board.

4. The electronic circuit according to claim 1, wherein
   the second printed wiring board is provided with a through hole at a connecting portion where the second printed wiring board is connected to the third printed wiring board,
   the third printed wiring board is provided with an engagement portion that passes through and engages with the through hole of the second printed wiring board, wherein
   the engagement portion of the third printed wiring board is soldered to the through hole of the second printed wiring board in a state where the engagement portion passes through the through hole.

5. The electronic circuit according to claim 4, wherein
   the second printed wiring board is provided with the antenna pattern,
   the engagement portion of the third printed wiring board has an expanding portion at a tip end, the expanding portion expanding in a direction toward the one edge of the third printed wiring board, and
   the engagement portion of the third printed wiring board is soldered to the through hole of the second printed wiring board in a state where the expanding portion is engaged with a perimeter edge of the through hole.

* * * * *